United States Patent [19]

Shay

[11] Patent Number: 5,323,067
[45] Date of Patent: Jun. 21, 1994

[54] SELF-DISABLING POWER-UP DETECTION CIRCUIT

[75] Inventor: Michael J. Shay, Arlington, Tex.

[73] Assignee: National Semiconductor Corporation, Santa Clara, Calif.

[21] Appl. No.: 48,542

[22] Filed: Apr. 14, 1993

[51] Int. Cl.⁵ .............................................. H03K 3/01
[52] U.S. Cl. .............................. 307/272.3; 307/296.4; 307/296.5; 307/264
[58] Field of Search ........................ 307/296.4–396.5, 307/272.3, 264

[56] References Cited

U.S. PATENT DOCUMENTS

| | | | |
|---|---|---|---|
| 4,254,347 | 3/1981 | Ray | 307/297 |
| 4,558,233 | 12/1985 | Nakamori | 307/362 |
| 4,633,107 | 12/1986 | Norsworthy | 307/594 |
| 4,888,497 | 12/1989 | Dallabora et al. | 307/272.3 |
| 4,970,408 | 11/1990 | Hanke et al. | 307/272.3 |
| 5,051,611 | 9/1991 | Kantz | 307/272.3 |
| 5,111,067 | 5/1992 | Wong et al. | 307/272.3 |
| 5,136,181 | 8/1992 | Yukawa | 307/296.1 |
| 5,159,206 | 10/1992 | Tsay et al. | 307/272.3 |

FOREIGN PATENT DOCUMENTS

| | | | |
|---|---|---|---|
| 0047727 | 4/1980 | Japan | 307/272.3 |
| 0077233 | 6/1980 | Japan | 307/296.5 |

OTHER PUBLICATIONS

United States SIR, Piasecki, Registration No. H497, Published Jul. 5, 1988.

Primary Examiner—Margaret Rose Wambach
Attorney, Agent, or Firm—Skjerven, Morrill, MacPherson, Franklin & Friel

[57] ABSTRACT

A CMOS power-up reset circuit provides a power-up output signal, useful to external circuits, when an applied power supply voltage exceeds a first predetermined value, and includes a ratioed transistor divider to generate a voltage on a sensing node which is a portion of the power supply voltage during a power-up transient. The circuit regeneratively latches when the rising power supply voltage and the sensing node voltage differ by more than a second predetermined value, such as a P-channel threshold voltage. A feedback signal subsequently disables current flow through the power-up reset circuit to virtually eliminate static power dissipation, and the power-up output signal is generated. Circuit provisions are incorporated to prevent capacitive coupling from the rising power supply voltage, through the N-wells of the P-channel transistors, to critical internal circuit nodes. The first predetermined value of the applied power supply voltage at which the circuit provides a power-up output signal is configurable by adjusting the ratio of two P-channel transistors.

31 Claims, 2 Drawing Sheets

SELF-DISABLING POWER-UP DETECTION CIRCUIT

BACKGROUND OF THE INVENTION

1. Field of the Invention

The present invention relates generally to power-up reset circuits, and more specifically to CMOS power-up reset circuits which provide a signal indicating that the power supply voltage applied to such a circuit exceeds a predetermined value.

2. Description of Related Art

Power-up reset circuits are frequently utilized in electronic systems for ensuring predictable operation after a system power-up. In some cases, a power-up reset circuit may generate a reset pulse after its applied power supply voltage has reached a safe operating value, which is then used to reset external circuits. These external circuits may be integrated together with the power-up reset circuit upon the same integrated circuit, or may be fabricated external to the power-up reset circuit. In other cases, a power-up reset circuit may provide a signal which disables operation of external circuits until the power supply voltage has reached a safe operating voltage. For example, such a signal can be applied to the asynchronous reset input of a flip-flop, or applied to an output disable input of a clock generator. After the system power supply reaches a predetermined level, this disabling signal generated by such a power-up reset circuit is then removed, thereby enabling the operation of the external circuits. In this way, external circuits are prevented from operation during times when the system power supply provided to those external circuits is below a voltage necessary to ensure adequate and reliable operation of the external circuits.

Frequently, power-up reset circuits have utilized resistor and capacitor time constant techniques to generate a reset signal after a delay governed by the associated RC time constant. Such circuits often incorporate large valued resistors and/or large valued capacitances, which require significant area to implement using most typical integrated circuit processes. Furthermore, these techniques are problematic if the slew rate of the power supply is comparable to, or slower than, the chosen RC time constant. In such cases, the power-up reset circuit will likely enable the external circuits prematurely. Alternatively, if the RC time constant is chosen to be very long, the power-up reset circuit may introduce an unnecessary and a disadvantageously long delay before the external circuits are enabled. A power-up reset circuit which requires no large RC time constants advantageously consumes less area in most implementations.

Power-up reset circuits which trip reliably at a particular predetermined value of a power supply, irrespective of the rise time of that supply, are more suitable for predictably enabling external circuits after the system power supply has reached an adequate voltage, while not introducing arbitrary and lengthy delays after reaching that value.

Historically, many power-up reset circuits have also consumed power after the power supply has fully stabilized at an operating voltage. For large systems with non-critical power requirements, this power dissipation is not problematic. However, in a battery powered system, even a minor amount of DC power consumed by a power-up reset circuit after system power-up can materially limit the battery operating time of the system. A power-up reset circuit which disables static or DC current flow after providing the power-up reset signal advantageously eliminates this unnecessary power dissipation after power-up.

In some instances, a power-up reset circuit exhibiting a hysteresis characteristic is advantageous for providing a power-up signal only after the power supply voltage has initially reached a safe operating voltage threshold, but which will not be re-asserted if the power supply voltage momentarily dips below that same safe operating voltage threshold. Such a dip can occur as a result of noise on a power supply conductor as might occur during a switching transient.

The power supply voltage at which a power-up reset circuit asserts a power-up signal is advantageously determined by ratios of similar or like circuit components and is advantageously relatively insensitive to variations in semiconductor parameters. Such a circuit advantageously requires as few critical sizes or ratios as possible to set this predetermined value of the necessary power supply voltage. Furthermore, it is an advantage for the circuit to be adjustable to include a predetermined voltage suitable for 3 volt operation (e.g., 2.0–2.5 volts), particularly for battery operation of the circuit.

SUMMARY OF THE INVENTION

These and other advantages are provided by the current invention which in one embodiment includes a circuit for providing at an output terminal an output signal indicating when a power supply voltage operatively coupled to the circuit exceeds a first predetermined value during a transition of the power supply voltage. The output signal has a first state during a first portion of the transition when the power supply voltage is less than the first predetermined value, and has a second state during a remaining portion of the transition when the power supply voltage exceeds the first predetermined value and thereafter. The circuit includes a generating means coupled between a first and a second power supply terminal for operatively generating a voltage on a sensing node which is a portion of the power supply voltage. A detecting means coupled to the generating means and coupled between the first and second power supply terminals is responsive to the voltage on the sensing node and operatively provides at a detecting node a detecting signal indicating when the voltage on the sensing node exceeds a second predetermined value corresponding to the power supply voltage exceeding the first predetermined value. A regeneration means is coupled to the generating means and to the detecting means and, responsive to the detecting signal, drives the voltage of the sensing node in a direction so as to reinforce the detecting signal. The circuit further includes a feedback means coupled to the generating means, the detecting means, and the regeneration means, which is responsive to the regeneration means driving the voltage of the sensing node, and which interrupts current flow through each of the generating means, the detecting means, and the regeneration means, thereby eliminating power dissipation therein. Lastly, the circuit includes an output means coupled to the sensing node and to the output terminal for providing the output signal in the first state, and for driving the output signal to the second state in response to the regeneration means driving the voltage of the sensing node.

DETAILED DESCRIPTION

Figure 1:
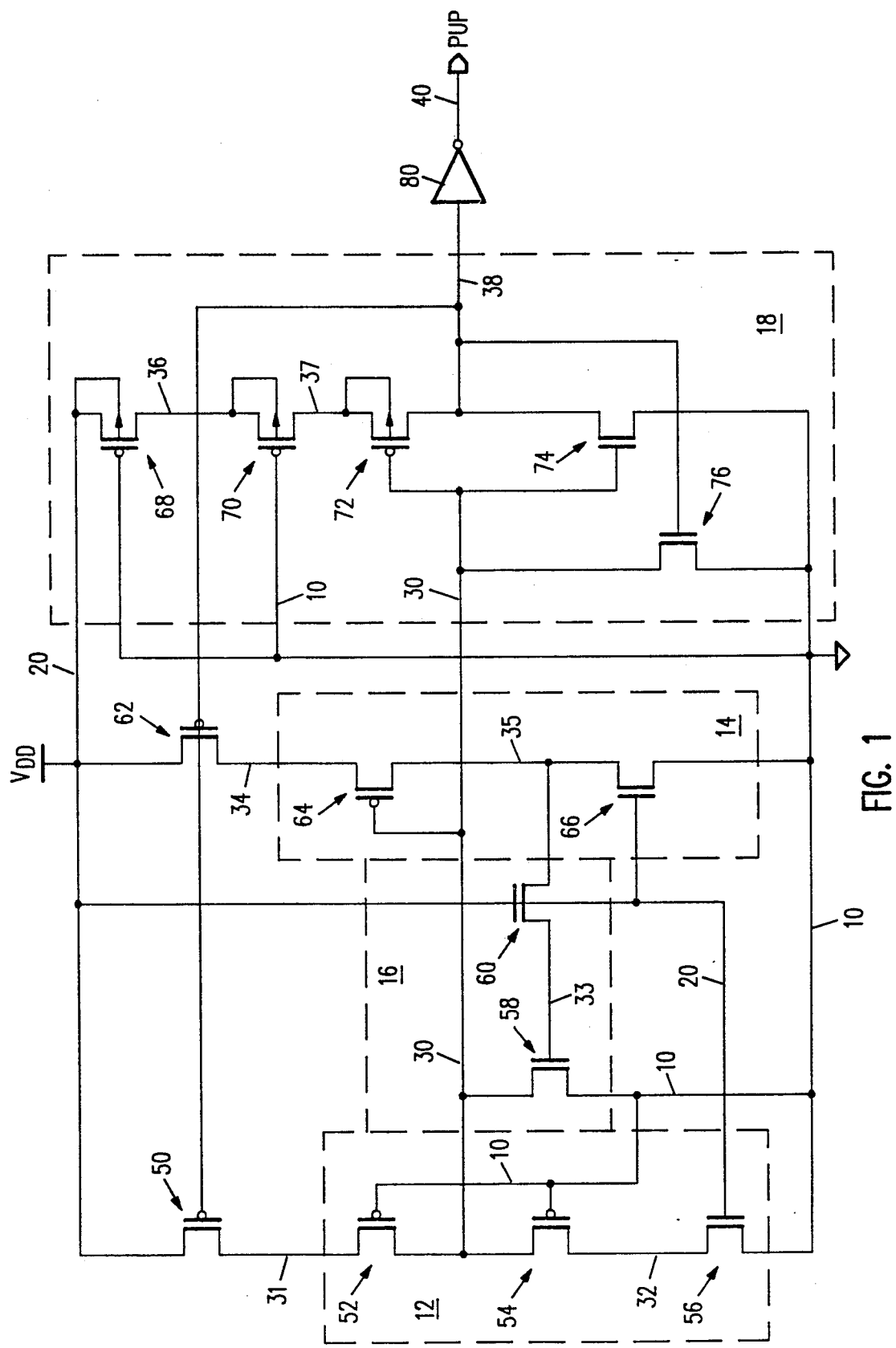
FIG. 1 is a schematic diagram of a power-up reset circuit in accordance with the present invention.

One embodiment of a power-up reset circuit in accordance with the current invention is depicted in FIG. 1. A power supply voltage, $V_{DD}$, is applied to power supply terminal 20, while a ground reference potential is applied to reference terminal 10. P-channel transistor 50 functions as a switch and, when conductive, generates a switch node 31 which follows the applied $V_{DD}$ voltage during power-up. A divider 12 is coupled between the switch node 31 and the reference terminal 10 and provides for a sensing node 30 which is a portion of the power supply voltage during a power-up transient. The divider 12 includes a P-channel MOS transistor 52, which has its source coupled to switch node 31, its gate coupled to the reference terminal 10, and its drain coupled to the sensing node 30. (Since typical MOS transistors are bidirectional devices and conduct current equally well from drain to source as from source to drain, the distinction between the source and drain terminals is usually arbitrary.) The source of a P-channel transistor 54 is likewise coupled to sensing node 30. The gate of transistor 54 is connected to the reference terminal 10 while its drain is coupled at node 32 to the drain of an N-channel MOS transistor 56, whose gate is connected to the power supply terminal 20 and whose source is connected to the reference terminal 10.

A P-channel switch transistor 62 couples a switch node 34 to the power supply terminal 20 and similarly generates, when conductive, a voltage on switch node 34 which follows the voltage of the applied power supply, $V_{DD}$. A detector 14 includes a P-channel transistor 64 whose source is coupled to the switch node 34 and whose drain is coupled at a detecting node 35 to the drain of an N-channel transistor 66. The gate of transistor 64 is coupled to the sensing node 30, while the gate and the source of transistor 66 are coupled to the power supply terminal 20 and the reference terminal 10, respectively. A regenerator 16 includes N-channel transistors 58 and 60 which serve to reinforce the voltage of the detecting node 35. The drain of transistor 60 is coupled to the detecting node 35, while the source is coupled at a regeneration node 33 to the gate of transistor 58. The drain of transistor 58 is coupled to the sensing node 30 while the source is coupled to the reference terminal 10. The gate of transistor 60 is connected to the power supply terminal 20.

A latch 18 includes a "strong N/weak P" CMOS inverter having an input coupled to the sensing node 30 and generating an output at node 38. The inverter is formed by a single N-channel transistor 74 and P-channel transistors 68, 70 and 72 connected in series. Further, the latch 18 includes a latching transistor 76 whose drain is coupled to the sensing node 30, whose source is coupled to the reference terminal 10, and whose gate is coupled to the inverter output node 38. The inverter output node 38 is coupled to the gates of switch transistors 50 and 62 as well as to the input of a buffer 80. The output of the buffer 80 is a power-up signal 40, also referenced as PUP.

In this embodiment, which is suitable for an N-well or twin-tub process, the load transistors 68, 70 and 72 are fabricated such that the N-well connection for each transistor is independently connectable and is connected to the respective source of each transistor.

Figure 2:
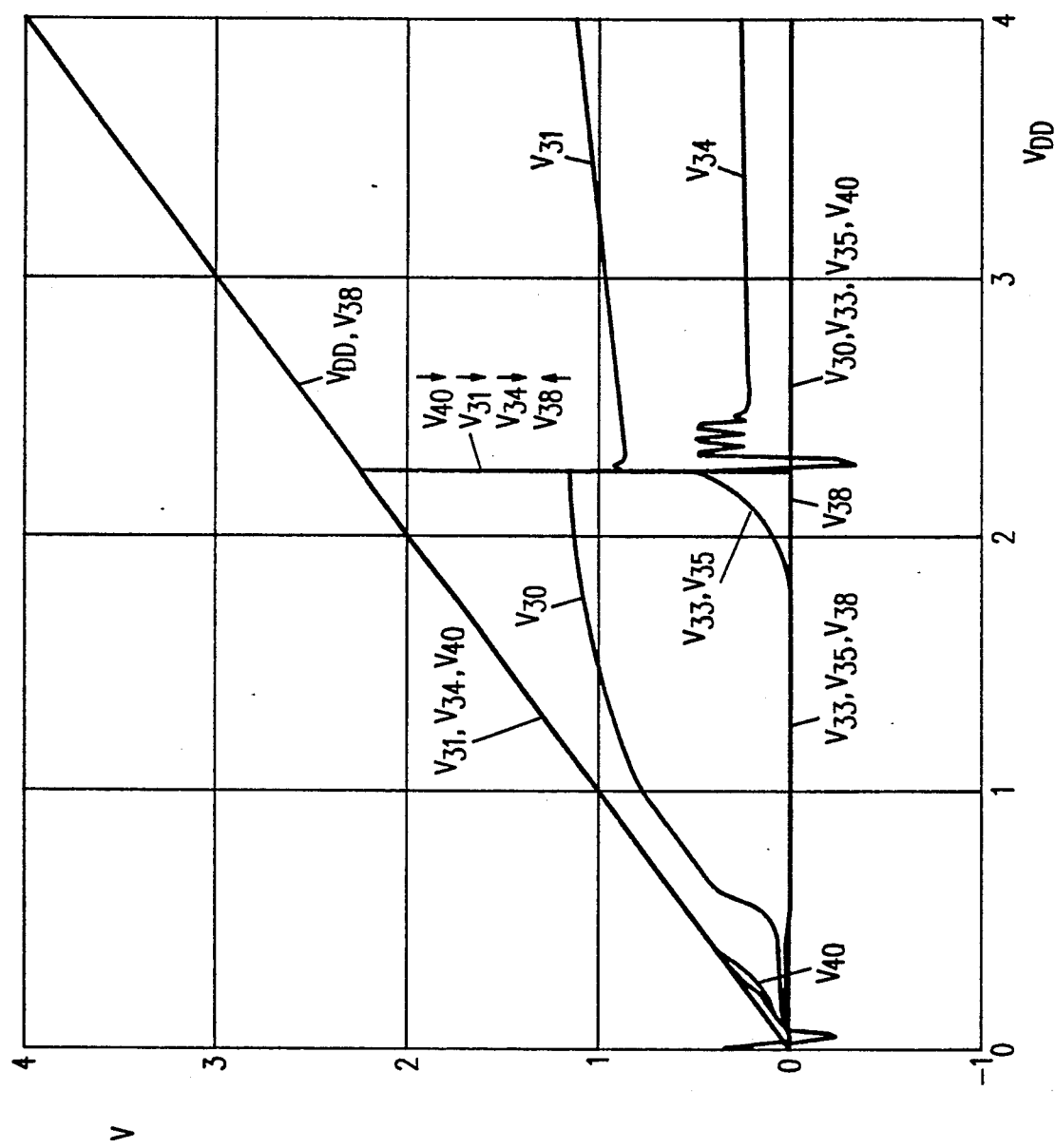
FIG. 2 is a chart showing voltage waveforms during a power-up transient of the circuit as illustrated in FIG. 1.

The operation of the circuit of FIG. 1 can be best appreciated by noting the waveforms depicted in FIG. 2. These waveforms illustrate the voltage of each of the major nodes of this circuit in response to a power-up transient, from zero volts to four volts, of a power supply voltage, $V_{DD}$, applied to the power supply terminal 20. In this example, the transistor sizes have been chosen to provide a transition of the power-up signal 40 to occur at a power supply voltage of approximately 2.3 volts, and which sizes are summarized in Table 1.

Initially, of course, all node voltages are at zero volts. As $V_{DD}$ starts to rise, switch transistors 50 and 62 become conductive as soon as $V_{DD}$ exceeds a P-channel threshold voltage, at which point the voltage of the switch node 31, $V_{31}$, and the voltage of the switch node 34, $V_{34}$, are brought to substantially the $V_{DD}$ voltage and subsequently follow the $V_{DD}$ transient upwards. The voltage generated on the sensing node 30, $V_{30}$, is principally determined by the ratio of transistors 52 and 54 and approximates the voltage generated by a resistive divider between the switch node 31 (which follows the voltage of $V_{DD}$) and the reference terminal 10. The N-channel transistor 56 is included in the current path of the voltage divider 12 to ensure that there is no initial current path to ground when the voltage of $V_{DD}$ is less than the N-channel threshold voltage, $V_{T,N}$, thereby ensuring that the voltage of the sensing node 30 is free to begin to rise.

TABLE 1

| Transistor Reference No. | Width (microns) | Length (microns) | Conductivity |
|---|---|---|---|
| 50 | 20 | 1.5 | P |
| 52 | 3 | 10 | P |
| 54 | 20 | 1 | P |
| 56 | 10 | 1 | N |
| 58 | 20 | 1 | N |
| 60 | 5 | 2 | N |
| 62 | 100 | 1 | P |
| 64 | 100 | 1 | P |
| 66 | 8 | 6 | N |
| 68 | 2.6 | 6 | P |
| 70 | 2.6 | 6 | P |
| 72 | 2.6 | 6 | P |
| 74 | 30 | 1 | N |
| 76 | 1 | 20 | N |

As $V_{DD}$ continues the positive-going transient, the voltage of the sensing node 30, which is a fraction of the $V_{DD}$ potential, also increases, although typically at a lesser rate of rise than the voltage of the switch node 31 and the switch node 34. Consequently, the gate-to-source voltage of transistor 64, which is the voltage of the sensing node 30 minus the voltage of the switch node 34 ($V_{30}-V_{34}$), increases as the voltage of these two nodes initially diverges with increasing $V_{DD}$. As the gate-to-source voltage of transistor 64 approaches a P-channel threshold voltage (illustratively for this example at a $V_{DD}$ voltage of approximately 2 volts), current starts to flow through transistor 64 and the voltage of the detecting node 35, $V_{35}$, begins to rise. Since $V_{DD}$ exceeds the N-channel threshold voltage, the voltage of the detecting node 35 is provided to the regeneration node 33 through transistor 60. As the voltage of the regeneration node 33, $V_{33}$, approaches the N-channel threshold voltage, transistor 58 becomes conductive and begins to drive the voltage of the sensing node 30 toward the ground reference potential coupled to the reference terminal 10, and which further increases the turn-on voltage of transistor 64. The increased current flow through transistor 64 causes an even higher voltage on the detecting node 35 which provides additional turn-on voltage at the regeneration node 33 to transistor 58. This, of course, provides a regeneration action which causes the voltage of the sensing node 30 to be brought to the ground reference potential, and which occurs corresponding to a $V_{DD}$ level, for this example, of approximately 2.3 volts.

In the embodiment of FIG. 1, all P-channel transistors are fabricated in one or more N-wells which are connected, as is common with N-well circuit techniques, to the upper power supply rail, power supply terminal 20, unless shown as connected differently (e.g., transistors 68, 70, and 72). Contact to the N-well of a P-channel transistor provides for a backside terminal for the transistor, and affords a means for biasing the backside of the transistor (i.e., the N-well) to a voltage at least as high as the greater of either the drain or source voltage of the transistor. Because of capacitive coupling effects through the N-well of transistor 64, the voltage of detecting node 35 is coupled above ground potential by the positive transition of the applied $V_{DD}$ power supply voltage, even before transistor 64 becomes conductive. Transistor 60 is provided to isolate regeneration node 33 from this capacitively-coupled voltage on detecting node 35, and prevents transistor 58 from prematurely becoming conductive before the desired value of $V_{DD}$ is reached.

As a consequence of this regeneration action bringing the voltage of the sensing node 30, $V_{30}$, to the ground reference potential, the voltage of the inverter output 38, $V_{38}$, is driven towards $V_{DD}$ and turns off switch transistors 50 and 62, thus interrupting current flow through the voltage divider and the detector. Because transistor 66 remains on (because its gate is connected to power supply terminal 20), the voltage of the detecting node 35 is brought back to the ground reference potential after the switch transistor 62 is shut off. Likewise, the voltage of the regeneration node 33 is brought back to ground potential due to transistor 60, which also remains on. The latching transistor 76 is provided to hold the voltage of the sensing node 30 at ground reference potential after the inverter output 38 switches high. Without this transistor, the sensing node 30 would be left in a high impedance state and could be coupled to unpredictable and undesirable voltages. With inverter output 38 switching to a high voltage, buffer 80 inverts this signal to provide the power-up signal 40, shown in FIG. 2 as $V_{40}$, with a low-going transition.

The inverter of latch 18 is preferably implemented as a "strong N/weak P" inverter to provide for an input threshold lower than the typical one-half of $V_{DD}$. This ensures that the inverter output 38 does not switch until the regeneration action of regenerator 16 is committed and the voltage of the sensing node 30 has been brought near to the ground reference potential.

The pullup device in the inverter of latch 18 is preferably implemented as several P-channel transistors (e.g., transistors 68, 70, and 72), each having a separate N-well connected to the source of each respective transistor, in order to reduce capacitive coupling from the $V_{DD}$ transient, though an N-well, onto inverter output 38. The voltage of node 36 is coupled by the $V_{DD}$ transient through the N-well of transistor 68, but since the N-well of transistor 70 is coupled to node 36 rather than to the power supply terminal 20, the voltage coupling onto node 37 from the N-well of transistor 70 is substantially reduced. Similarly, the voltage coupled onto output node 38 is even more reduced than the voltage coupled onto node 37. Such a series-connected P-channel structure ensures that the voltage of the inverter output 38 stays at the ground reference potential, rather than following the $V_{DD}$ transient due to capacitive coupling which could cause errant switching of the buffer 80 and a premature power-up reset signal 40.

After the inverter output 38 switches high and turns off switch transistors 50 and 62, the static current flow through the entire circuit is reduced to a negligible level of typically 8 nA for a $V_{DD}=4$ volts. The voltages of the switch node 31, $V_{31}$, and of the switch node 34, $V_{34}$, are left at intermediate, but harmless, voltages when the inverter output 38 switches high and turns off transistors 50 and 62.

When the applied $V_{DD}$ is subsequently reduced to a voltage below the predetermined value necessary to generate the power-up reset signal 40, the latch 18 keeps the voltage of the sensing node 30 at ground potential, and the voltage of the inverter output 38 stays high. Consequently, the power-up reset signal 40 remains at ground and the circuit exhibits a hysteresis characteristic. Furthermore, with the device sizes as shown in Table 1, the circuit is able to ride through a total removal of the applied $V_{DD}$ for a period as long as 20 milliseconds and maintain the power-up reset signal 40 at a low voltage for the entire duration. The design and sizing of the series-connected P-channel transistors in the inverter of latch 18 can be chosen to provide for a wide variation of duration times that the $V_{DD}$ power supply can be removed without causing the circuit to reset and without causing an additional power-up reset signal 40 transition to occur when the $V_{DD}$ power supply voltage is re-applied to the circuit.

Because no large resistors or capacitors are utilized, the power-up reset circuit of FIG. 1 (using transistor sizes of Table 1) can be fabricated, using a nominal 1$\mu$ process, in less than 10 mils$^2$ of silicon area.

While the waveforms of FIG. 2 suggest that the power-up reset circuit of FIG. 1 switches in response to a $V_{DD}$ of approximately 2.3 volts (which is a particularly advantageous value for 3 volt operation), the desired $V_{DD}$ level can be adjusted by adjusting the relative ratios of transistors 52 and 54. Furthermore, while the waveforms of FIG. 2 depict circuit operation where the N-channel threshold voltage is lower than the P-channel threshold voltage (which is typical of many CMOS processes), the power-up reset circuit of FIG. 1 functions adequately well even if the N-channel threshold voltage is greater than the P-channel threshold voltage (as might be the case for certain statistical process corners).

Using a nominal N-channel threshold voltage of 0.8 volts and a nominal P-channel threshold voltage of 1.0 volts, the $V_{DD}$ voltage at which the power-up reset signal 40 is asserted can be easily varied from less than 1.5 volts to over 4.0 volts by adjusting the size ratio of transistors 52 and 54. Furthermore, such a circuit as in FIG. 1 is particularly well suited to detecting a $V_{DD}$ between 1.5 and 2.5 volts, which is extremely desirable for 3 volt battery operation.

While the above circuit descriptions reference an N-well CMOS technology, the teachings of this disclosure can be advantageously applied to other semiconductor process technologies, such as a P-well or a twin-tub CMOS technology.

While the invention has been described with respect to the embodiments set forth above, the invention is not necessarily limited to these embodiments. For example, one skilled in the art could "invert" the circuit by interchanging the role of the N-channel and P-channel transistors. Numerous transistor configurations can be implemented which will provide a circuit having analogous operation. Accordingly, other embodiments, variations, and improvements not described herein are not necessarily excluded from the scope of the invention, which is defined by the following claims.

I claim:

1. A circuit for providing at an output terminal an output signal indicating when a power supply voltage operatively coupled to the circuit exceeds a first predetermined value during a transition of the power supply voltage, the circuit having a first power supply terminal for receiving the power supply voltage and having a second power supply terminal for receiving a ground reference potential, the output signal having a first state during a first portion of the transition when the power supply voltage is less than the first predetermined value, and having a second state during a remaining portion of the transition when the power supply voltage exceeds the first predetermined value and thereafter, comprising:

generating means coupled between the first and second power supply terminals for operatively generating a voltage on a sensing node which is a portion of the power supply voltage;

detecting means coupled to the generating means and coupled between the first and second power supply terminals, being responsive to the voltage on the sensing node, for operatively providing at a detecting node a detecting signal indicating when the voltage on the sensing node exceeds a second predetermined value corresponding to the power supply voltage exceeding the first predetermined value;

regeneration means coupled to the generating means and the detecting means and responsive to the detecting signal, for driving the voltage of the sensing node in a direction so as to reinforce the detecting signal;

feedback means coupled to the generating means, the detecting means, and the regeneration means, being responsive to the regeneration means driving the voltage of the sensing node, for interrupting current flow through each of the generating means, the detecting means, and the regeneration means, thereby eliminating power dissipation therein; and output means coupled to the sensing node and to the output terminal for providing the output signal in the first state, and for driving the output signal to the second state in response to the regeneration means driving the voltage of the sensing node.

2. A circuit as in claim 1 wherein the generating means comprises two transistors of the same conductivity type connected in series, forming the sensing node therebetween.

3. A circuit as in claim 1 wherein the generating means comprises:

a first transistor having a source coupled to the first power supply terminal, a gate coupled to the second power supply terminal, and a drain coupled to the sensing node; and a second transistor having a source coupled to the sensing node, a gate coupled to the second power supply terminal, and a drain coupled to the second power supply terminal.

4. A circuit as in claim 3 wherein the generating means further comprises a third transistor having a drain coupled to the drain of the second transistor, a gate coupled to the first power supply terminal, and a source coupled to the second power supply terminal.

5. A circuit as in claim 1 wherein the first predetermined value differs from the second predetermined value by an amount substantially equal to a threshold voltage of a transistor.

6. A circuit as in claim 5 wherein the detecting means comprises:

a fourth transistor having a drain coupled to the detecting node, a gate coupled to the sensing node, and a source coupled to the first power supply terminal; and a load means connected between the detecting node and the second power supply terminal.

7. A circuit as in claim 6 wherein the load means comprises a fifth transistor having a drain coupled to the detecting node, a gate coupled to the first power supply terminal, and a source coupled to the second power supply terminal.

8. A circuit as in claim 6 wherein the regeneration means comprises a sixth transistor having a drain coupled to the sensing node, a gate coupled to the detecting node, and a source coupled to the second power supply terminal.

9. A circuit as in claim 8 wherein the regeneration means further comprises a seventh transistor coupling the gate of the sixth transistor to the detecting node, the seventh transistor having a drain coupled to the detecting node, a gate coupled to the first power supply terminal, and a source coupled to the gate of the sixth transistor.

10. A circuit as in claim 1 wherein the feedback means comprises:

a first inverter having an input coupled to the sensing node, and an output;

a first switch means coupling the generating means to the first power supply terminal, being responsive to the first inverter output; and a second switch means coupling the detecting means to the first power supply terminal, being responsive to the first inverter output.

11. A circuit as in claim 10 wherein the feedback means further comprises a latching transistor having a drain coupled to the first inverter input, a gate coupled to the first inverter output, and a source coupled to the second power supply terminal.

12. A circuit as in claim 11 wherein the first inverter comprises:

an eighth transistor having a drain coupled to the first inverter output, a gate coupled to the first inverter input, and a source coupled to the second power supply terminal; and a plurality of series-connected load transistors coupling the first inverter output to the first power supply terminal.

13. A circuit as in claim 12:

wherein each of the plurality of series-connected load transistors has a backside terminal which is connectable independently of other transistors; and wherein the backside terminal of each of the plurality of series-connected load transistors is connected to each load transistor's respective source terminal.

14. A circuit as in claim 13:
wherein the gate of a series-connected load transistor coupled to and nearest the output is connected to the first inverter input; and
wherein the gates of the remaining series-connected load transistors are coupled to the second power supply terminal.

15. A circuit as in claim 14 wherein the output means comprises a buffer having an input coupled to the first inverter output, and having an output coupled to the output terminal.

16. A circuit as in claim 15:
wherein the first state of the output signal is a voltage substantially driven to follow the power supply voltage; and
wherein the second state of the output signal is a low voltage substantially driven to the ground reference potential.

17. A method for providing to an output a signal indicating when a power supply voltage operatively coupled to a circuit block exceeds a first predetermined value during a transition of the power supply voltage, the output signal having a first state during a first portion of the transition when the power supply voltage is less than the first predetermined value, and having a second state during a remaining portion of the transition when the power supply voltage exceeds the first predetermined value and thereafter, comprising the steps of:
generating a voltage on a sensing node which is a portion of the power supply voltage during the first portion of the transition;
detecting when the sensing node voltage and the power supply voltage differ by more than a second predetermined amount, wherein the portion of the power supply voltage generated on the sensing node and the second predetermined value are chosen so that the sensing node voltage and the power supply voltage differ by more than the second predetermined value when the power supply voltage exceeds the first predetermined value;
latching the sensing node subsequent to the detecting step;
interrupting static current flow through the circuit block subsequent to the latching step, thereby eliminating power dissipation therein; and
driving the output signal from the first state to the second state subsequent to the latching step.

18. A method as in claim 17 wherein the second predetermined value corresponds to a threshold voltage of a P-channel transistor.

19. A method as in claim 18 wherein the first predetermined value is chosen from a range between 1.5 and 4.0 volts.

20. A method as in claim 19 Wherein the first predetermined value is chosen from a range between 1.5 and 2.5 volts.

21. A CMOS power-up reset circuit for providing at an output terminal a power-up reset signal indicating when a power supply voltage operatively coupled to the circuit exceeds a first predetermined value during a transition of the power supply voltage, the output signal having a first state during a first portion of the transition when the power supply voltage is less than the first predetermined value, and having a second state during a remaining portion of the transition when the power supply voltage exceeds the first predetermined value and thereafter, comprising:
a first power supply terminal for receiving the power supply voltage;
a second power supply terminal for receiving a ground reference potential;
a voltage divider coupled between the first and second power supply terminals having an output coupled to a sensing node;
a detector coupled between the first and second power supply terminals, having an input coupled to the sensing node and having an output coupled to a detecting node;
a regenerator having an input coupled to the detecting node, and having an output coupled to the sensing node for driving the sensing node voltage in a direction so as to reinforce the detecting node output; and
a buffer having an input coupled to the sensing node and having an output coupled to the output terminal.

22. A CMOS power-up reset circuit as in claim 21 wherein the voltage divider comprises:
a first transistor having a source coupled to the first power supply terminal, a gate coupled to the second power supply terminal, and a drain coupled to the sensing node; and
a second transistor having a source coupled to the sensing node, a gate coupled to the second power supply terminal, and a drain coupled to the second power supply terminal.

23. A CMOS power-up reset circuit as in claim 22 wherein the voltage divider further comprises a third transistor having a drain coupled to the drain of the second transistor, a gate coupled to the first power supply terminal, and a source coupled to the second power supply terminal.

24. A CMOS power-up reset circuit as in claim 23 wherein the detector comprises:
a fourth transistor having a drain coupled to the detecting node, a gate coupled to the sensing node, and a source coupled to the first power supply terminal;
a fifth transistor having a drain coupled to the detecting node, a gate coupled to the first power supply terminal, and a source coupled to the second power supply terminal; and
wherein the regenerator comprises a sixth transistor having a drain coupled to the sensing node, a gate coupled to the detecting node, and a source coupled to the second power supply terminal.

25. A CMOS power-up reset circuit as in claim 24 wherein the regenerator further comprises a seventh transistor coupling the gate of the sixth transistor to the detecting node, the seventh transistor having a drain coupled to the detecting node, a gate coupled to the first power supply terminal, and a source coupled to the gate of the sixth transistor.

26. A CMOS power-up reset circuit as in claim 25 further comprising:
a first inverter having an input coupled to the sensing node, and an output;
a first switch transistor coupling the voltage divider to the first power supply terminal, having a gate coupled to the first inverter output; and
a second switch transistor coupling the detector to the first power supply terminal, having a gate coupled to the first inverter output.

27. A CMOS power-up reset circuit as in claim 26 further comprising a latching transistor having a drain coupled to the first inverter input, a gate coupled to the first inverter output, and a source coupled to the second power supply terminal.

28. A CMOS power-up reset circuit as in claim 27 wherein the first inverter comprises:
- an eighth transistor having a drain coupled to the first inverter output, a gate coupled to the first inverter input, and a source coupled to the second power supply terminal; and
- a plurality of series-connected load transistors coupling the first inverter output to the first power supply terminal, each having a backside terminal which is connectable independently of other transistors and connected to each load transistor's respective source terminal.

29. A CMOS power-up reset circuit as in claim 28:
- wherein the gate of a series-connected load transistor coupled to and nearest the first inverter output is connected to the first inverter input; and
- wherein the gates of the remaining series-connected load transistors are coupled to the second power supply terminal.

30. A CMOS power-up reset circuit as in claim 29:
- wherein the first, second, and fourth transistors comprise P-channel MOS transistors; and
- wherein the third, fifth, sixth, and seventh transistors comprise N-channel MOS transistors.

31. A CMOS power-up reset circuit as in claim 30:
- wherein the first and second switch transistors and the plurality of series-connected load transistors comprise P-channel MOS transistors; and
- wherein the eighth transistor and the latching transistor comprise N-channel MOS transistors.

* * * * *